(12) United States Patent
Chung et al.

(10) Patent No.: US 9,799,497 B2
(45) Date of Patent: Oct. 24, 2017

(54) PATTERNED PROCESSING KITS FOR MATERIAL PROCESSING

(71) Applicant: Taiwan Semiconductor Manufacturing Company Limited, Hsinchu (TW)

(72) Inventors: Chen-Fang Chung, Hsinchu County (TW); Chih-Tsang Tseng, Hsinchu (TW); Hsiao-Chuan Lee, Hsinchu County (TW); Kuo-Pin Chuang, Hsinchu County (TW); Shuen-Liang Tseng, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 13/968,633

(22) Filed: Aug. 16, 2013

(65) Prior Publication Data

US 2015/0047563 A1  Feb. 19, 2015

(51) Int. Cl.
*C23C 16/04* (2006.01)
*H01J 37/34* (2006.01)
*C23C 14/56* (2006.01)
*H01J 37/32* (2006.01)

(52) U.S. Cl.
CPC ............ *H01J 37/34* (2013.01); *C23C 14/564* (2013.01); *H01J 37/32477* (2013.01)

(58) Field of Classification Search
None
See application file for complete search history.

(56) References Cited

U.S. PATENT DOCUMENTS

| | | | |
|---|---|---|---|
| 6,364,957 B1* | 4/2002 | Schneider et al. | 118/728 |
| 2003/0146084 A1* | 8/2003 | Fu | 204/192.2 |
| 2003/0168168 A1* | 9/2003 | Liu et al. | 156/345.3 |
| 2004/0245098 A1* | 12/2004 | Eckerson | 204/298.01 |
| 2005/0284372 A1* | 12/2005 | Murugesh | C23C 16/4404 118/715 |
| 2006/0090706 A1* | 5/2006 | Miller | C23C 14/50 118/728 |
| 2006/0292310 A1* | 12/2006 | Le et al. | 427/446 |
| 2007/0102286 A1* | 5/2007 | Scheible et al. | 204/298.01 |
| 2007/0283884 A1* | 12/2007 | Tiller | C23C 14/564 118/715 |
| 2008/0141942 A1* | 6/2008 | Brown | C23C 14/564 118/723 R |
| 2010/0040768 A1* | 2/2010 | Dhindsa | 427/8 |

* cited by examiner

*Primary Examiner* — Joseph Miller, Jr.
(74) *Attorney, Agent, or Firm* — Jones Day

(57) ABSTRACT

Systems and methods are provided for material processing. An example apparatus includes a process-kit component containing a first groove and a second groove. The first groove and the second groove are disposed to form a pattern on a surface of the process-kit component. The process-kit component is configured to be placed into a chamber to reduce material deposition on one or more parts of the chamber during material processing.

20 Claims, 4 Drawing Sheets

PATTERNED PROCESSING KITS FOR MATERIAL PROCESSING

FIELD

The technology described in this disclosure relates generally to material processing and more particularly to apparatuses for material processing.

BACKGROUND

Modern technology of material processing often involves transferring a particular material onto another bulk or wafer material. For example, for manufacturing semiconductor devices, certain target materials may be deposited onto a substrate in a processing chamber under certain conditions. The processing chamber may include a chamber wall that encloses a process zone, a process gas supply, a gas energizer to energize the process gas, a gas exhaust to remove spent gas and maintain a gas pressure in the chamber, and a substrate support to hold the semiconductor substrate. During the deposition process, the target materials may be deposited onto certain chamber components, such as the chamber wall.

SUMMARY

In accordance with the teachings described herein, systems and methods are provided for material processing. An example apparatus includes a process-kit component containing a first groove and a second groove. The first groove and the second groove are disposed to form a pattern on a surface of the process-kit component. The process-kit component is configured to be placed into a chamber to reduce material deposition on one or more parts of the chamber during material processing.

In one embodiment, an apparatus for material processing includes a first process-kit component and a second process-kit component. The first process-kit component includes a first plurality of grooves disposed to form a first pattern on a first surface of the first process-kit component. The second process-kit component includes a second plurality of grooves disposed to form a second pattern on a second surface of the second process-kit component. One of the first plurality of grooves intersects with another of the first plurality of grooves at an angle. The second plurality of grooves are approximately parallel to each other.

In another embodiment, an apparatus for material processing includes a deposition ring, a cover ring, and a coil-support component. The deposition ring includes a first plurality of grooves disposed to form a first pattern on a first surface of the deposition ring. The cover ring includes a second plurality of grooves disposed to form a second pattern on a second surface of the cover ring. The coil-support component includes a third plurality of grooves disposed to form a third pattern on a third surface of the coil-support component.

DETAILED DESCRIPTION

Figure 1:
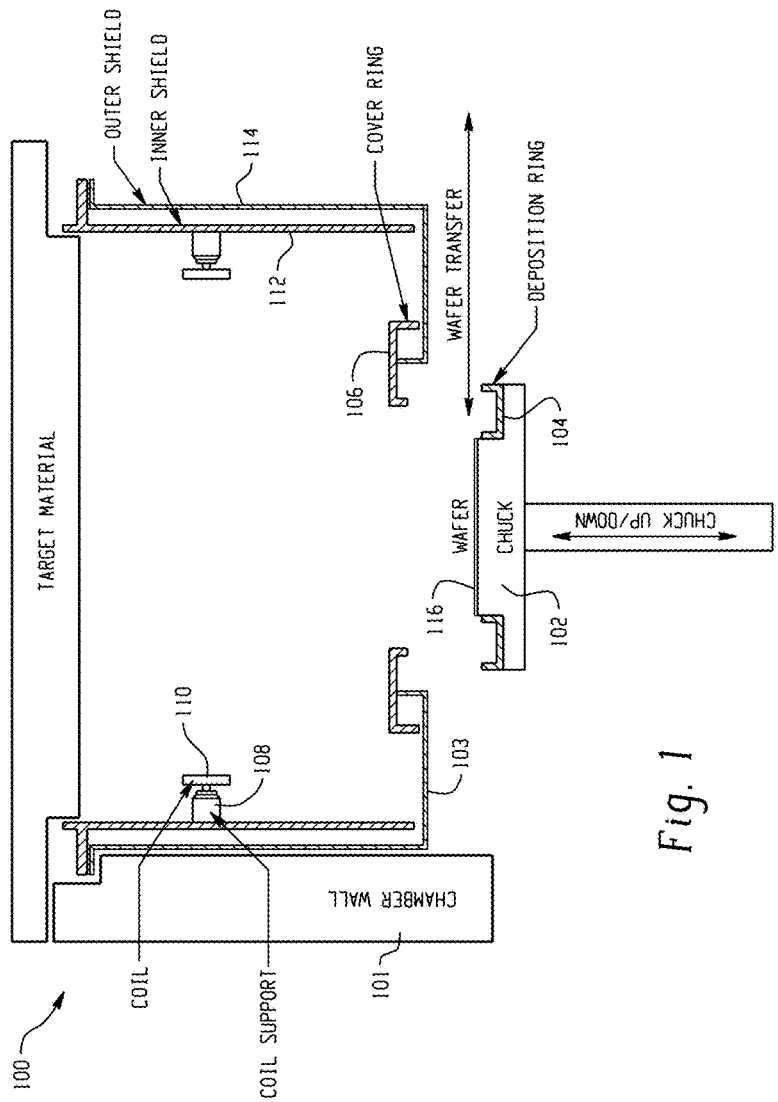
FIG. 1 depicts an example diagram of a process kit in a processing chamber.

A process kit may be used to protect components of a processing chamber from receiving undesirable material deposition. FIG. 1 depicts an example diagram of a process kit in a processing chamber. As shown in FIG. 1, the processing chamber 100 includes a chamber wall 101 and a substrate support 102. The process kit 103 may be placed within the chamber 100 to prevent material deposition on the chamber components, such as the chamber wall 101 and the substrate support 102. Specifically, the process kit 103 includes a deposition ring 104, a cover ring 106, a coil support component 108, one or more coils 110, an inner shield 112 and an outer shield 114. For example, the deposition ring 104 may include an annular band surrounding the substrate support 102. The cover ring 106 may at least partially cover the deposition ring 104.

Figure 2:
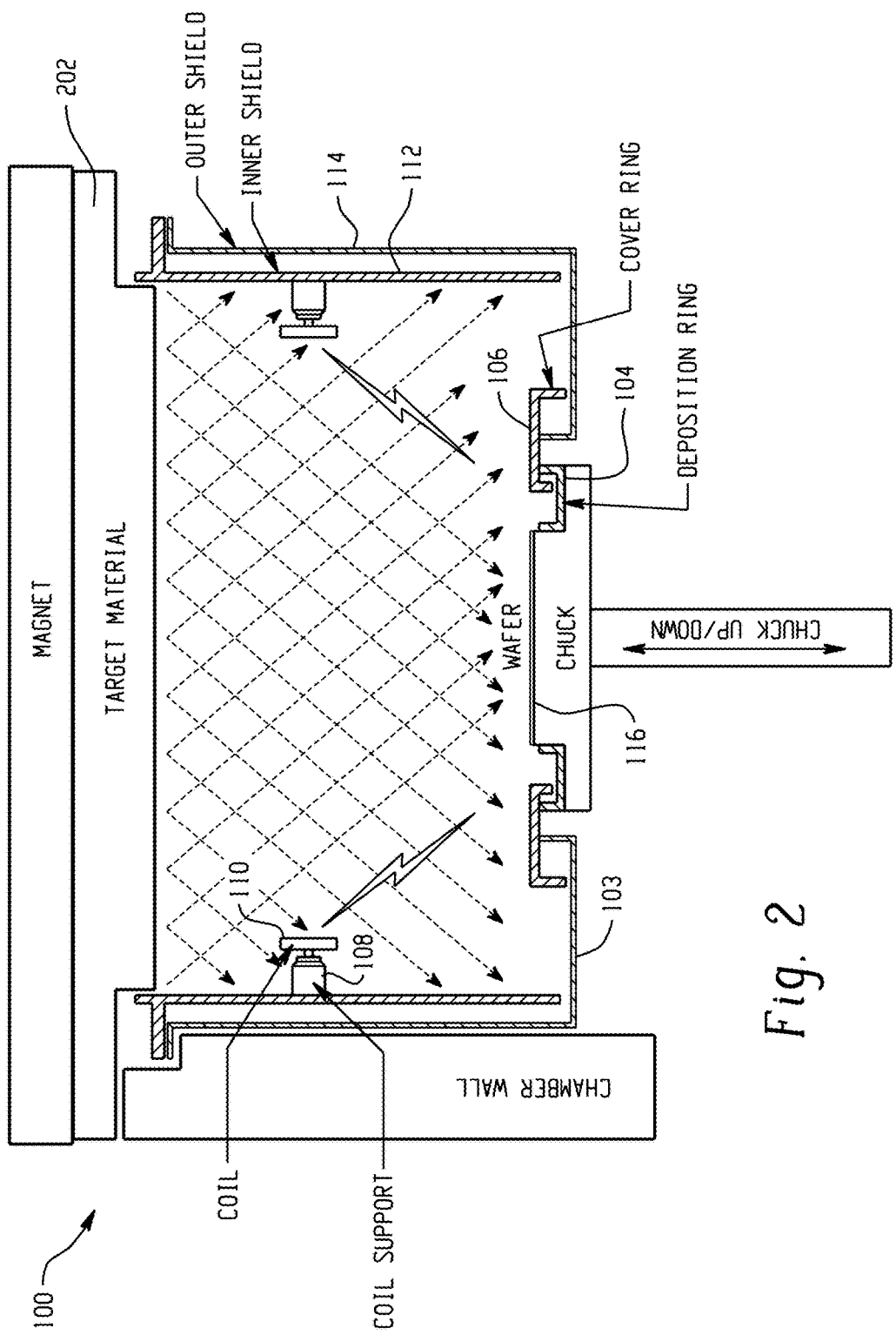
FIG. 2 depicts an example diagram of a process kit in a processing chamber in operation.

In operation, a substrate 116 (e.g., a wafer) may be introduced into the chamber 100 through a substrate-loading inlet, and placed onto the substrate support 102. For example, as shown in FIG. 2, a plasma may be produced to impact the surface of a target material 202 which may be electrically biased. Atoms/molecules/ions may be generated from the target material 202 and may be subsequently deposited on the substrate 116.

For example, the substrate support 102 may be maintained at an electrically floating potential or grounded during material processing. As an example, the substrate support 102 may include an electrostatic chuck and/or a heater. As an example, the inner shield 112 and the outer shield 114 are configured to reduce formation of material deposits on the chamber wall 101.

Figure 3:
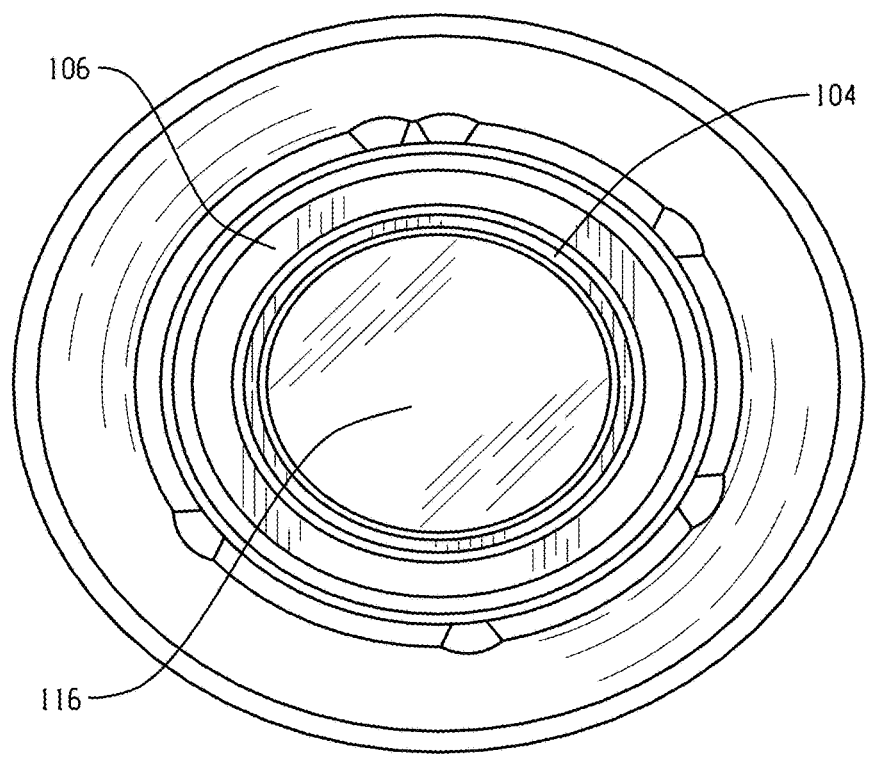
FIG. 3 depicts an example diagram showing a top view of certain components of a process kit.

FIG. 3 depicts an example diagram showing a top view of certain components of the process kit 103. As shown in FIG. 3, the deposition ring 104 and the cover ring 106 each include an annular part, and may be configured to reduce deposition on the substrate support 102 (e.g., peripheral portions of the support 102). In addition, the cover ring 106 may be configured to reduce deposition below the substrate 116.

During the material processing, the process kit 103 may receive large amounts of material deposits. The adhesion of the material deposits on the components of the process kit 103 may degrade with the accumulation of the deposited materials. Under certain circumstances, the deposited materials may flak off or peel off due to film stress, which may cause contamination to the process chamber 100. Carved patterns (e.g., grooves) may be introduced in the components of the process kit 103 to increase contact surface and improve adhesion of material deposits.

Figure 4:
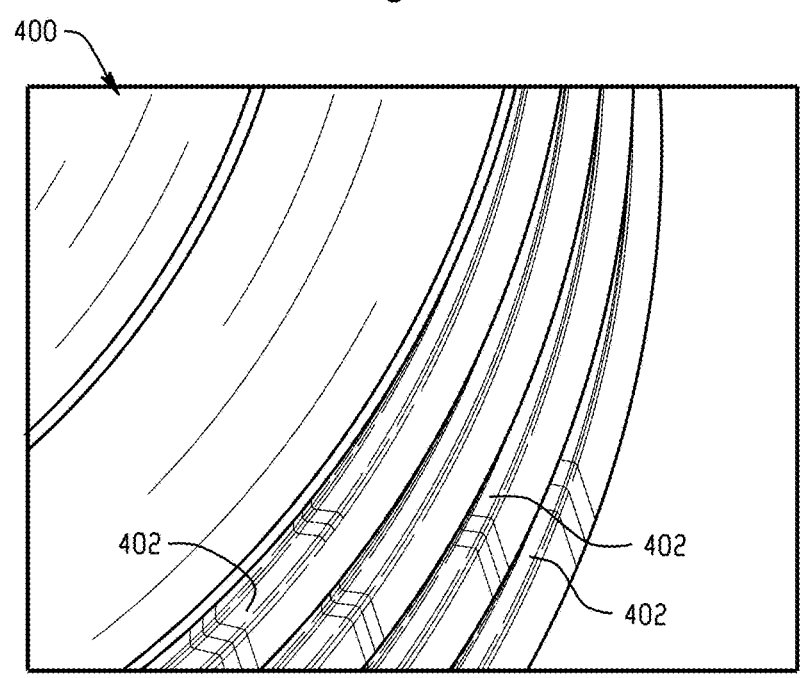
FIG. 4 depicts an example diagram showing grooves forming a pattern on a process-kit component.

FIG. 4 depicts an example diagram showing grooves forming a pattern on a process-kit component. As shown in FIG. 4, the process-kit component 400 includes an annular part, and a plurality of grooves 402 may be carved on the annular part which receives material deposits (e.g., TaN) in operation. The grooves 402 may each form a circular pattern and may be approximately parallel to each other. For example, the process-kit component 400 corresponds to the cover ring 106 (as shown in FIGS. 1 an 2). In another example, the grooves 402 may be carved on a top surface of the process-kit component 400. In one embodiment, the grooves 402 may each have a width of about 1 mm and a depth of about 0.5 mm.

Figure 5:
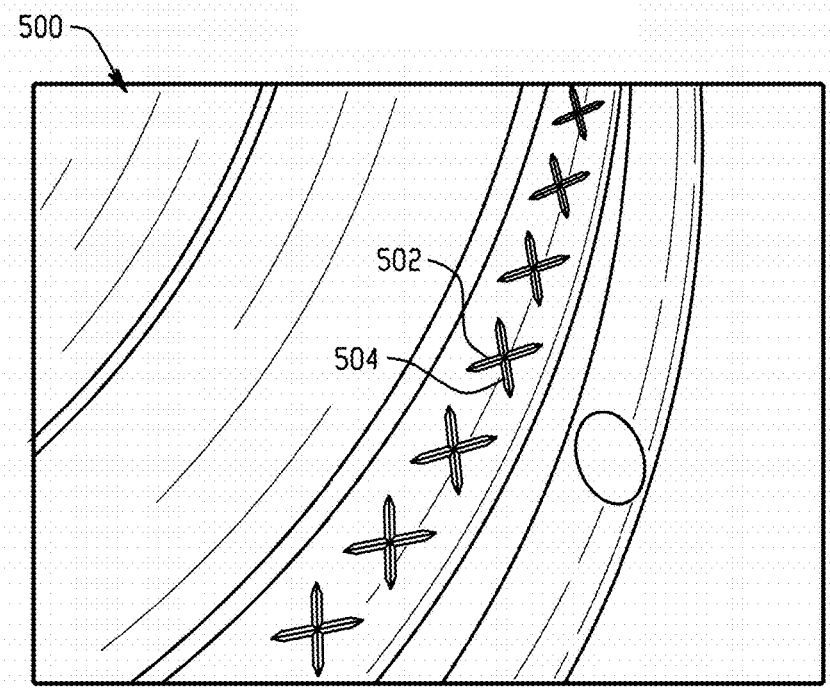
FIG. 5 depicts another example diagram showing grooves forming a pattern on a process-kit component.

FIG. 5 depicts another example diagram showing grooves forming a pattern on a process-kit component. A plurality of grooves may be carved on the process-kit component 500 which receives material deposits (e.g., TaN) in operation. For example, a groove 502 may intersect with another groove 504 at an angle which may be smaller than, approximately equal to, or larger than 90°. Other grooves may form similar patterns as the grooves 502 and 504, as shown in FIG. 5. As an example, the process-kit component 500 corresponds to the deposition ring 104 (as shown in as shown in FIGS. 1 an 2). In another example, the process-kit component 500 may include an annular part and the grooves may be carved on a top surface of the annular part. In one embodiment, the grooves (e.g., 502 and 504) may each have a width of about 0.5 mm and a depth of about 0.5 mm.

Figure 6:
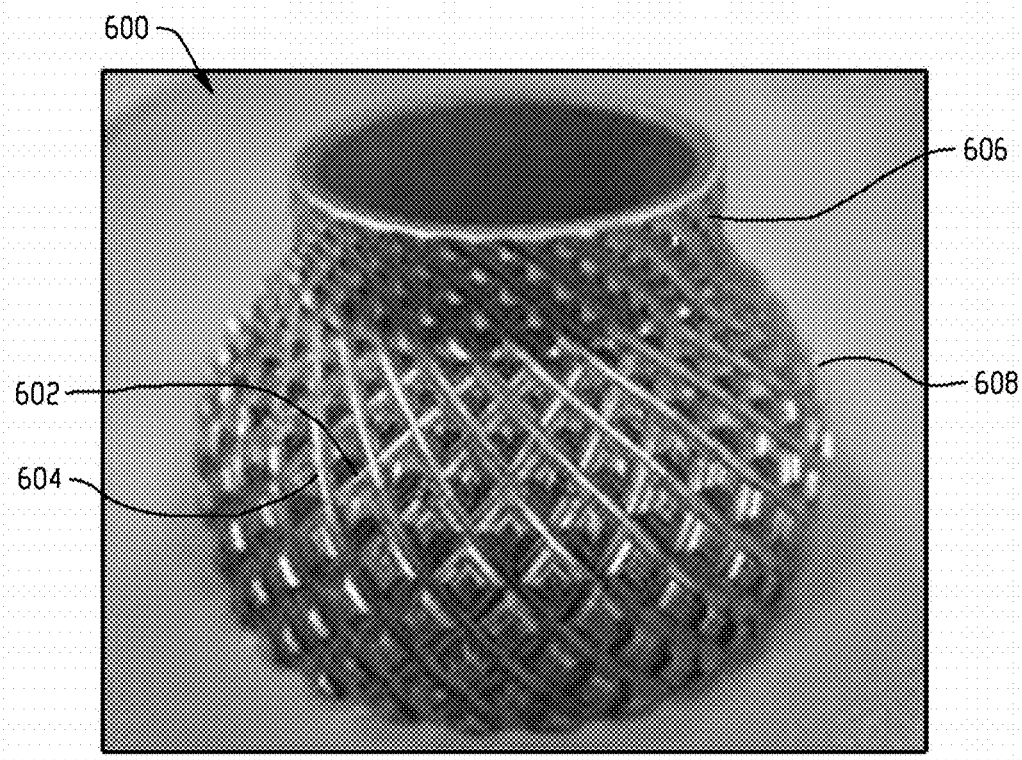
FIG. 6 depicts yet another example diagram showing grooves forming a pattern on a process-kit component.

FIG. 6 depicts yet another example diagram showing grooves forming a pattern on a process-kit component. A plurality of grooves may be carved on the process-kit component 500, e.g., to form a mesh pattern. Each groove may intersect with one or more grooves, as shown in FIG. 6. For example, a groove 602 may intersect with multiple grooves (e.g., a groove 604) at a same angle or different angles respectively, where the intersection angle(s) may be smaller than, approximately equal to, or larger than 90°. As an example, the process-kit component 600 corresponds to the coil-support component 108 (as shown in as shown in FIGS. 1 an 2). The process-kit component 600 may include a globe-shaped part 608, and the plurality of grooves are disposed on a surface of the globe-shaped part 608. Further, the process-kit 600 may include an annular part 606, and one or more grooves may be disposed on a surface of the annular part 606.

Depending upon embodiments, one or more benefits may be achieved using the carved patterns described above. These benefits and various additional objects, features and advantages can be fully appreciated with reference to the detailed description and accompanying drawings. For example, the implementation of the carved patterns may increase the contact surface between material deposits (e.g., TaN) and a particular process-kit component, and prolong the lifetime of the process kit 103. Also, the usage of the carved patterns may reduce contamination in the processing chamber 100 so as to improve the quality of material processing.

This written description uses examples to disclose the invention, include the best mode, and also to enable a person skilled in the art to make and use the invention. The patentable scope of the invention may include other examples that occur to those skilled in the art. One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the invention. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, the term "on" as used herein (including in the claims) may not indicate that a first layer "on" a second layer is directly on and in immediate contact with the second layer unless such is specifically stated; there may be a third layer or other structure between the first layer and the second layer on the first layer. The term "under" as used herein (including in the claims) may not indicate that a first layer "under" a second layer is directly under and in immediate contact with the second layer unless such is specifically stated; there may be a third layer or other structure between the first layer and the second layer under the first layer. The term "in" used herein (including in the claims) for a situation where a device/component is fabricated "in" a layer does not indicate that all parts of the device/component are completely contained inside the layer unless such is specifically stated; there may be one or more parts of the device/component exist outside of the layer. The term "substrate" may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials). The embodiments of a device or article described herein can be manufactured, used, or shipped in a number of positions and orientations. Persons skilled in the art will recognize various equivalent combinations and substitutions for various components shown in the figures.

What is claimed is:

1. An apparatus for material processing using a chamber that includes a substrate support, the apparatus comprising:
   a process kit including:
      a cover ring disposed in the chamber, including a horizontal ring portion having an inner circumferential member that extends downward from the horizontal ring portion;
      a deposition ring coupled to the substrate support, having a substantially U-shaped cross section, including a horizontal portion, and inner and outer vertical portions that extend upward from the horizontal portion, and movable with the substrate support relative to the cover ring from a lower position to an upper position, where in the upper position the outer vertical portion of the deposition ring abuts a bottom surface of the horizontal ring portion of the cover ring, and the inner circumferential member of the cover ring is received into a space defined by the inner and outer vertical portions of the deposition ring;
      a first groove; and
      a second groove, each of the first groove and the second groove being disposed to form a circular pattern on at least one of a top surface of the cover ring or a top surface of the horizontal portion of the deposition ring and extending along substantially the entire circumference of the at least one of the cover ring or the deposition ring, wherein the process kit is configured to reduce material deposition on one or more parts of the chamber during material processing.

2. The apparatus of claim 1, wherein the at least one of the cover ring and the deposition ring includes an annular part, the first groove and the second groove being disposed in the annular part.

3. The apparatus of claim 1, wherein the first groove and the second groove are approximately parallel to each other.

4. The apparatus of claim 1, wherein:
the cover ring has a horizontal portion that includes the top surface of the cover ring, and a vertical portion that extends downward from the horizontal portion of the cover ring and toward the horizontal portion of the deposition ring; and
the outer vertical portion of the deposition ring abuts the horizontal portion of the cover ring when the deposition ring is at the upper position.

5. The apparatus of claim 1, wherein the first groove has a width of about 1 mm and a depth of about 0.5 mm, and the second groove has a width of about 1 mm and a depth of about 0.5 mm.

6. The apparatus of claim 1, wherein:
the process kit further includes a shield disposed in the chamber;
the deposition ring and the shield define therebetween a gap when the deposition ring is at the upper position; and
the cover ring is configured to cover the gap.

7. The apparatus of claim 1, wherein the process kit further includes a third groove and a fourth groove.

8. The apparatus of claim 7, wherein the third groove intersects with the fourth groove at an angle.

9. The apparatus of claim 8, wherein the angle is smaller than or larger than 90°.

10. The apparatus of claim 8, wherein the angle is approximately 90°.

11. The apparatus of claim 7, wherein the third groove is approximately parallel to the fourth groove.

12. The apparatus of claim 7, wherein the first groove, the second groove, the third groove and the fourth groove are disposed to form a mesh pattern.

13. The apparatus of claim 7, wherein the third groove and the fourth groove intersects on the top surface of the horizontal portion of the deposition ring.

14. The apparatus of claim 7, wherein the third groove has a width of about 0.5 mm and a depth of about 0.5 mm, and the fourth groove has a width of about 0.5 mm and a depth of about 0.5 mm.

15. The apparatus of claim 7, wherein the process kit further includes a coil-support component configured to support one or more coils used for material processing.

16. The apparatus of claim 15, wherein:
the coil-support component includes a globe-shaped part; and
the third groove and the fourth groove are disposed in the globe-shaped part.

17. An apparatus for material processing, the apparatus comprising:
a first process-kit component including:
a circumferential member having a substantially U-shaped cross section and comprising a horizontal surface and an outer vertical wall facing an inner vertical wall, the outer vertical wall, the inner vertical wall, and the horizontal surface defining a circumferential space; and
a first plurality of grooves disposed to form a first pattern on a first surface of the first process-kit component; and
a second process-kit component including:
a second plurality of grooves disposed to form a second pattern on a top surface of the second process-kit component;
a circumferential projection extending away from the top surface, wherein
each of the second plurality of grooves forms a circular pattern and extends along substantially the entire circumference of the second process-kit component,
one of the first plurality of grooves intersects with another of the first plurality of grooves at an angle,
the second plurality of grooves are approximately parallel to each other and are configured to improve adhesion of material deposits,
wherein the circumferential projection is received into the circumferential space and either a bottom surface of the second process-kit component is in contact with the first process-kit component, or the circumferential projection is in contact with the first process-kit component.

18. An apparatus for material processing using a chamber that includes a substrate support and a chamber wall, the apparatus comprising:
a deposition ring configured to reduce formation of material deposits on a top surface of the substrate support, having a substantially U-shaped cross section, and including a horizontal portion, a pair of vertical portions that extend from the horizontal portion, and a first plurality of grooves disposed to form a first pattern on a top surface of the horizontal portion of the deposition ring;
an outer shield configured to reduce formation of material deposits on the chamber wall and to define a gap with the deposition ring;
an inner shield configured to reduce formation of material deposits on the outer shield;
a cover ring configured to cover the gap and including a second plurality of grooves disposed to form a second pattern on a second surface of the cover ring, the cover ring is arranged to contact the deposition ring during material processing and includes an inner circumferential member that extends towards the deposition ring, the inner circumferential member arranged to be received into a space defined by the pair of vertical portions that extend from the horizontal portion; and
a coil-support component mounted to the inner shield and including a third plurality of grooves disposed to form a third pattern on a third surface of the coil-support component, wherein each of the grooves in at least one of the deposition ring, the cover ring, and the coil-support component forms a circular pattern and extends along substantially the entire circumference of the at least one of the deposition ring, the cover ring, and the coil-support component.

19. The apparatus of claim 1, wherein the top surface of the horizontal portion of the deposition ring is formed with the first and second grooves.

20. The apparatus of claim 1, wherein the top surface of the cover ring is formed with the first and second grooves.

* * * * *